United States Patent [19]
Shinagawa et al.

[11] Patent Number: 5,832,177
[45] Date of Patent: Nov. 3, 1998

[54] METHOD FOR CONTROLLING APPARATUS FOR SUPPLYING STEAM FOR ASHING PROCESS

[75] Inventors: Keisuke Shinagawa; Shuzo Fujimura, both of Kawasaki; Yuuji Matoba, Kobe; Yoshimasa Nakano, Kobe; Tatsuya Takeuchi, Kobe; Takeshi Miyanaga, Kobe, all of Japan

[73] Assignees: Fujitsu Limited, Kawasaki; Shinko Seiki Co., Ltd, Kobe, both of Japan

[21] Appl. No.: 426,185

[22] Filed: Apr. 21, 1995

Related U.S. Application Data

[62] Division of Ser. No. 853,700, filed as PCT/JP91/01361 Oct. 5, 1991.

[30] Foreign Application Priority Data

| Oct. 5, 1990 | [JP] | Japan | 2-267985 |
| Oct. 5, 1990 | [JP] | Japan | 2-267986 |

[51] Int. Cl.$^6$ ............ A61M 33/06; F22B 29/06; B05C 11/00
[52] U.S. Cl. ............ 392/394; 118/667; 392/397
[58] Field of Search ............ 392/394, 396, 392/397, 398; 118/715, 724, 666, 667; 427/248.1

[56] References Cited

U.S. PATENT DOCUMENTS

| 756,242 | 4/1904 | Kuhn | 219/430 |
|---|---|---|---|
| 1,715,035 | 5/1929 | Hoyt | 392/403 |
| 2,279,000 | 4/1942 | Larson | 392/394 |
| 2,437,963 | 3/1948 | Langmuir et al. | 392/400 X |
| 3,180,014 | 4/1965 | Gellar | 118/715 |
| 3,348,984 | 10/1967 | Pammer | 148/174 |
| 3,603,767 | 9/1971 | Scicchitano | 219/430 |
| 3,734,168 | 5/1973 | DeGroote | 122/450 |
| 3,744,474 | 7/1973 | Shaw | 219/401 |
| 3,760,773 | 9/1973 | Christensen | 392/400 X |
| 3,818,819 | 6/1974 | Shulz et al. | 219/401 |
| 4,049,863 | 9/1977 | Vassiliou | 428/324 |
| 4,088,023 | 5/1978 | Berleue et al. | 73/334 |
| 4,116,016 | 9/1978 | Roop et al. | 392/400 |
| 4,276,243 | 6/1981 | Partus | 261/128 |
| 4,341,107 | 7/1982 | Blair et al. | 73/3 |
| 4,619,844 | 10/1986 | Pierce et al. | 427/248.1 |
| 4,640,221 | 2/1987 | Barbee et al. | 118/689 |
| 4,646,630 | 3/1987 | McCoy et al. | 392/399 X |
| 4,668,854 | 5/1987 | Swan | 392/402 |
| 5,186,120 | 2/1993 | Ohnishi et al. | 118/667 |
| 5,279,129 | 1/1994 | Ito | 62/50.2 |
| 5,281,885 | 1/1994 | Watanabe et al. | 310/328 |
| 5,451,258 | 9/1995 | Hillman et al. | 118/715 |

FOREIGN PATENT DOCUMENTS

1530914 of 0000 France .

*Primary Examiner*—Teresa J. Walberg
*Assistant Examiner*—Sam Paik
*Attorney, Agent, or Firm*—Staas & Halsey

[57] ABSTRACT

A method for controlling an apparatus for supplying steam to an ashing process. The apparatus includes a closed water-containing vessel formed from a material having good heat conductive characteristics for evaporating water to provide steam to a vacuum chamber housing an ongoing ashing process. In accordance with the procedure, steam evaporated in a closed steam supply tank is introduced into a vacuum chamber via a pressure reducing mass-flow controller. The temperature of the water in the supply tank, the temperature of the steam in the pipes leading from the supply tank to the mass-flow controller, the temperature of the steam in the pipes from the mass-flow controller to the vacuum chamber and the temperature of the steam in the mass-flow controller itself are all independently controlled such that the temperature in the water tank is equal to or less than the temperature in the pipes leading to and from the mass-flow controller and the temperature in the pipes is less than or equal to the temperature in the mass-flow controller.

4 Claims, 8 Drawing Sheets

METHOD FOR CONTROLLING APPARATUS FOR SUPPLYING STEAM FOR ASHING PROCESS

This application is a divisional of application Ser. No. 07/853,700 filed as PCT/JP91/01361 Oct. 5, 1991, (presently pending).

BACKGROUND OF THE INVENTION

1. Field of the Invention

This invention relates to an apparatus for supplying steam to a vacuum chamber to perform an ashing process of a photoresist (exfoliation process of organic film) in a production process of semiconductor devices or the like and to a method for controlling the same.

In the production of semiconductor devices, liquid crystals, high polymer materials, ceramics or the like, gas phase plasma processes are sometimes used for treating the surfaces of work pieces in a vacuum or low pressure environment, because such processes are generally easy to control.

Often, however, the pressure of a gas suitable for use in such a process is not high enough. In particular the pressure of steam is low, i.e., about 20 Torr at room temperature and steam pressure very much depends on the temperature of the steam. Therefore, steam is a gas which is difficult to supply in large amounts and in a well controlled condition.

In the production of semiconductor devices, steam may be used as a reaction gas in a process for ashing resist or other resin films. Therefore, an apparatus for providing a stable supply of steam is needed so as to improve process accuracy.

The steam supplying apparatus is used to supply the steam from a closed water tank containing water via a mass-flow controller to a vacuum chamber.

In such steam supply systems it is desirable to supply the steam in a stable condition without raising the temperature of the portions of the pipe system not in the water tank, including the valves and the mass-flow controller, relative to the water temperature in the water tank, and without blockage of steam in the mass-flow controller.

The present invention is applicable to a steam supplying apparatus and to a control method therefor which satisfy the above-mentioned requirements.

2. The Prior Art Background

The steam generation chambers used in connection with the processes described above for generating steam to be supplied to a vacuum chamber are often made of quartz, which presents some drawbacks, such as uneven temperature and difficulty in precise control of evaporative flow, since quartz is easily damaged and does not have good thermal conductivity. Recently, metal chambers having their inside surfaces made of soda glass coated with enamel have become known. However, in such chambers, foreign substances (Na, Fe, Ca or the like) present in the glass may enter and contaminate the water.

In a steam supplying method, the steam is supplied as a result of the pressure difference between the saturated vapor pressure of steam (about 24 Torr at 25° C.) and the pressure inside the chamber.

To keep the flow of steam supply constant, it is therefore necessary to keep the temperature of the steam generation chamber constant. However, in the prior art, temperature has been controlled using a mantle heater, which has its own limitations and has not been sufficient.

Also in the prior art, the steam sometimes deteriorates the pump oil of a rotary pump or the like and the deteriorated oil then remains in the vacuum chamber to reduce the vacuum. Thus, steam has become one of the most unfavorable gases for introduction into the vacuum chamber. As a result no method for positively introducing steam into a vacuum chamber has been developed.

Figure 5:
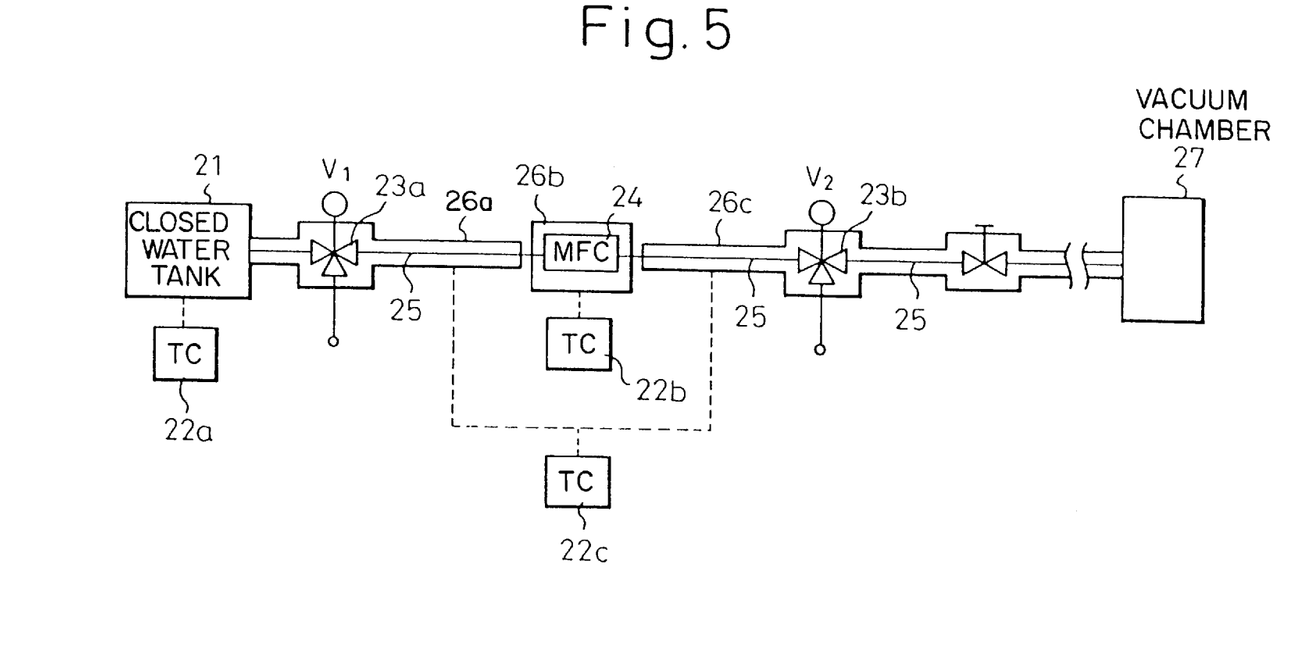
FIG. 5 is a schematic diagram showing another embodiment of a steam supplying apparatus and a method for controlling the same.

FIG. 5 illustrates a system for positively introducing steam into a gas phase process. In this case a carrier gas is bubbled through water and the wet carrier gas is then introduced into the vacuum chamber.

Figure 6:
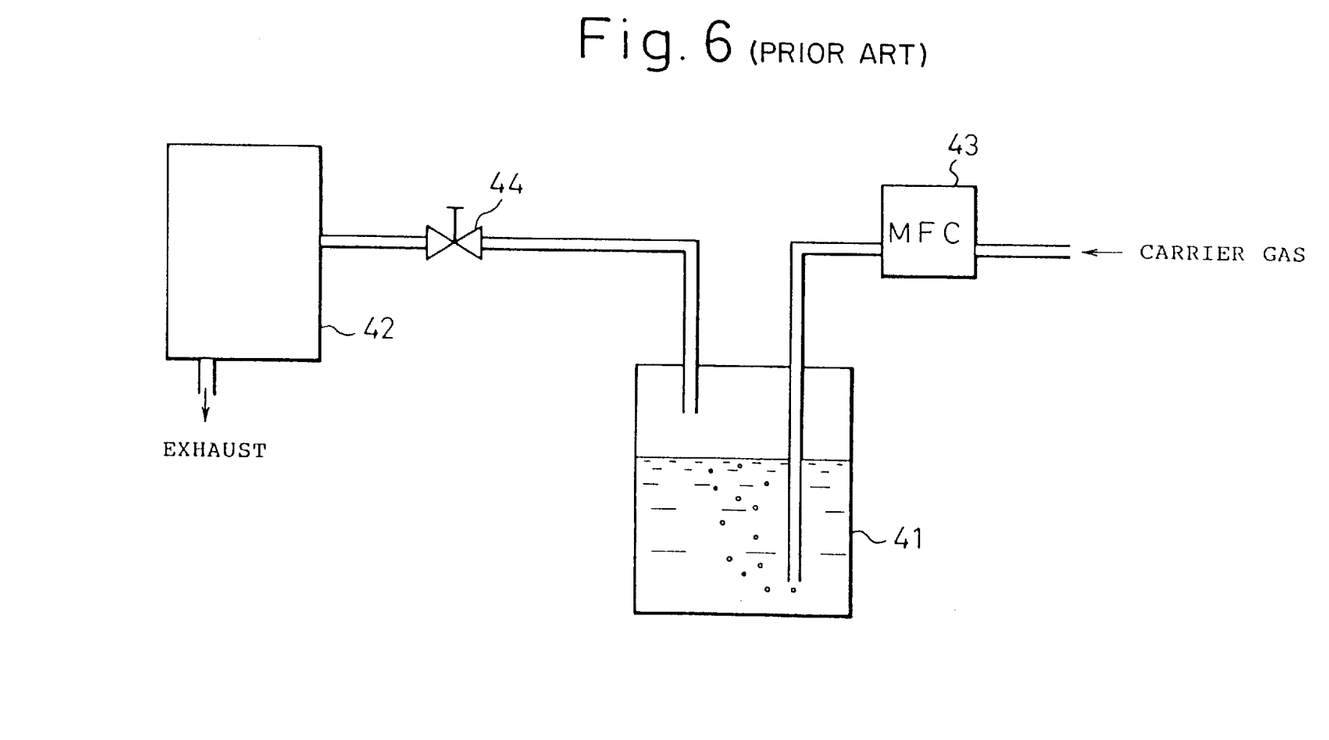
FIG. 6 is a schematic diagram for explaining a prior art steam supply apparatus.

FIG. 6 is a schematic diagram illustrating a prior art steam supply system.

The system of FIG. 6 includes a bubbler tank 41 filled with water, a vacuum chamber 42 where a gas process is performed, a mass-flow controller (MFC) 43, and a valve 44.

A carrier gas is introduced via the mass-flow controller 43 into the water in the bubbler tank 41 where water vapor for the gas process is picked up. The water vapor (or steam) is then introduced into the vacuum chamber 42 with the carrier gas.

In such a method, the amount of steam actually introduced into the process depends on the partial pressure of steam in the mixture of the carrier gas and the steam. In general, the partial pressure of the carrier gas is higher than the partial pressure of the steam, and the amount of steam is therefore not so much.

In order to introduce more steam, it is therefore necessary to use a large amount of carrier gas and a large air exhaust system is required to maintain the vacuum chamber in an evacuated condition.

In this method the variable range of the ratio between the carrier gas and the steam is limited.

Thus, in prior art apparatuses, it has been difficult to stably control the flow of steam because the steam always contains contamination. It also has been difficult to control the flow of steam to be introduced into the vacuum chamber.

A prior art steam temperature control system will now be described.

A conventional method for introducing steam to a vacuum system includes the use of a water tank, pipes and a mass-flow controller which are arranged so that a constant temperature is uniformly maintained and controlled throughout the system. However, this method has problems, such as, the constant temperature system itself is relatively large, the cost of the system is high, and it is difficult to control the temperature in the system.

A conventional method for solving such problems comprises controlling the amount of steam introduced into the system by controlling the water temperature in the water tank and elevating the temperature in other portions of the system and in the mass-flow controller so as to schematically prevent blockage.

Figure 7:
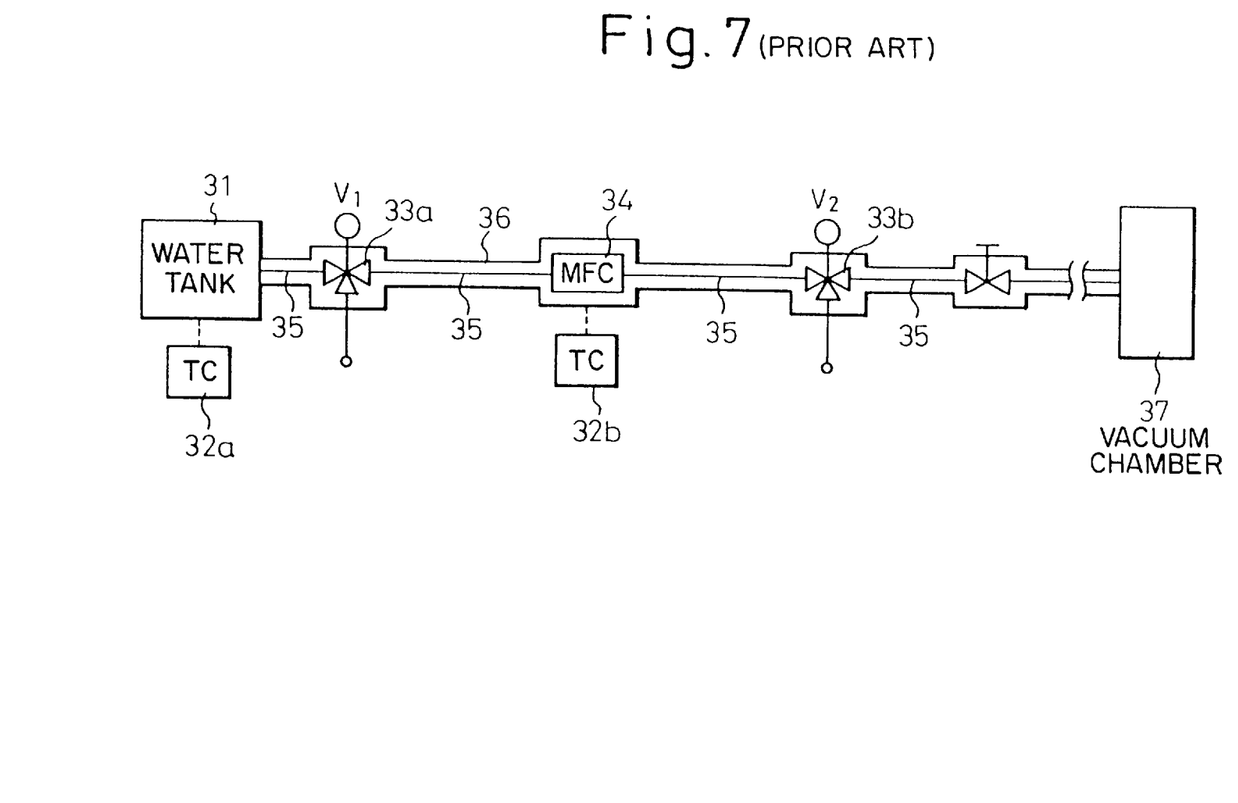
FIG. 7 is a schematic diagram illustrating a prior art steam supplying method and steam supplying apparatus having a mass-flow controller.

A prior art system is illustrated in FIG. 7.

As shown in FIG. 7, the prior art system for supplying steam includes a steam supplying apparatus having a mass-flow controller. The illustrated steam supplying apparatus can be used in connection with a reduced pressure CVD (Chemical vapor deposition) process of the like. The system illustrated in FIG. 7 includes a water tank 31, temperature controllers 32a and 32b, valves 33a and 33b, a mass-flow controller 34, a heater 36 and a vacuum chamber 37.

As shown in FIG. 7, the steam flow from the water tank 31 is determined by the rate of evaporation of water and temperature of the water in water tank 31 is controlled with a double bath system using a temperature controller 32a. The pressure curve of water evaporation is relatively steep as compared with TEOS (Tetra ethyl orthosilicate; $Si(OC_2H_5)_4$), and it is preferred to precisely control the temperature in the water tank 31 using the temperature controller 32a.

The temperature in the portions of the system outside the water tank 31, including the pipes 35, the valves 33a and 33b and the mass-flow controller 34, is raised by a tube heater 36 and the temperature controller 32b so that the steam is not blocked. The heater 36 is provided so as to entirely enclose the pipes 35, the valves 33a and 33b and the mass-flow controller 34, and a temperature controller 32b is provided, such as at the mass-flow controller 34, so as to control the temperature of the heater 36.

In the prior art steam supplying apparatus as shown in FIG. 7, the portions of the system not in the water tank 31, including the pipes 35, the valves 33a and 33b and the mass-flow controller 34, are entirely covered by the heater 36 and the temperature thereof is controlled by a single temperature control means 32b. Also, in this steam supplying apparatus, for example, a water temperature of 50° C. in the water tank 31 is necessary to supply the steam at a flow rate of 600 cc/min. The pipe system including the pipes 35, the valves 33a and 33b and the mass-flow controller 34 must be kept at a temperature over 60° C. by the heater 36 and the temperature control means 32b in order to prevent the steam from being blocked.

Also, a water temperature of 55° C. in the water tank 31 is necessary to supply the steam at a flow rate of 900 cc/min., and in this case, the temperature of the portions of the system outside the water tank 31 must be over 80° C.

If it is necessary to supply the steam at a flow rate of 1100 cc/min., the water temperature in the water tank 31 must be 60° C. However, in this case, even if the temperature of the portions of the system outside the water tank 31 is raised to 90° C., the steam is easily blocked at the mass-flow controller 34. Also, in this conventional steam supplying apparatus, depending on the structure and thermal capacity of the mass-flow controller 34, the temperature of the inner walls of the mass-flow controller 34, which are contacted by the passing steam, is a little lower than that of the front and rear parts thereof. As a result, there is a great possibility that condensation will occur.

Thus, if a large amount of steam is to be supplied, such as a flow of 1100 cc/min., the amount of evaporation from the water tank 31 increases as an exponential function, and therefore, the amount of steam delivered from the water tank 31 can be increased by increasing the temperature or the water surface area. However, to prevent the portions of the system outside the water tank 31 from being blocked with steam, there is the problem that the system pipes must be kept at a relatively high temperature. In particular, to heat the system pipes to a temperature over 100° C. it would be difficult to use pipes formed from resin in view of its lack of resistance to heat. If metal is used in place of resin as the pipe material, the pipes will generally be subject to erosion, and when used in manufacturing semiconductor devices, metal pipes may cause a metal contamination. Accordingly the use of metal pipes is not appropriate.

SUMMARY OF THE INVENTION

A first object of the present invention is to provide a steam supplying apparatus and a method for controlling the same, in which the temperature can easily be controlled with less contamination and the steam flow may be stabilized.

A second object of the present invention is to provide a steam supplying apparatus and a method for controlling the same, in which it is not necessary to elevate the temperature of the portions of the pipe system outside the water tank, including valves and mass-flow controller to a significant extent relative to the temperature of the water tank, and the steam supply can be stabilized without blockage of the steam at the mass-flow controller.

In order to attain the first object of the present invention, there is provided:

1) a steam supplying apparatus for introducing steam evaporated in a closed chamber to a vacuum chamber for use in an ongoing process, wherein the maximum cross-sectional horizontal area of the chamber is M and the minimum cross-sectional area is S and wherein M/S<8:

2) a steam supplying apparatus as set forth in item 1) above, wherein a submerged inside surface of the closed chamber is coated with resin, and the closed chamber has a steam outlet disposed above the surface of the water in the closed chamber;

3) a method for controlling a steam supplying apparatus for introducing steam evaporated in a closed chamber to a vacuum chamber via a mass-flow controller, wherein the steam flow rate controlled in said mass-flow controller is in the range of 50–100% of the maximum steam flow rate as determined by the vapor pressure of water in the closed chamber: or 4) a method for controlling a steam supplying apparatus as set forth in item 3) above, wherein the water temperature in the closed chamber is controlled in such a manner that the maximum steam flow rate as determined by the vapor pressure of water in the closed chamber is smaller than the controllable maximum flow of said mass-flow controller.

The operation of the steam supplying apparatus of this invention will now be described in detail.

According to the present invention, a steam generation chamber containing water is made of a material, such as an aluminum alloy or the like, having a high thermal conductivity so the temperature thereof may be effectively controlled, and an inside surface thereof is coated with a resin to reduce contamination in the chamber without reducing the thermal conductivity.

In addition, according to the present invention, a closed steam generation chamber is connected via a pipe system to a vacuum chamber and the closed chamber is kept at a constant temperature by a surrounding hot water chamber. Therefore, it is possible to uniformly and thermal effectively control the temperature of the chamber, and a stable steam supply can thus be attained.

According to the present invention, the flow of steam supplied from the closed chamber depends on the water surface area in the closed chamber. Taking into consideration such a fact, when the maximum horizontal cross-sectional area of said chamber is M and the minimum cross-sectional area is S, and when M/S<8, it has been found that a stable steam supply can be attained.

In a practical downstream ashing process using a gas mixture containing oxygen and steam, if a steam supply chamber satisfying M/S<8 is used, a stable flow of steam and a stable ashing rate may be attained. This feature is exemplified in the apparatus shown in FIG. 2.

In a practical procedure, if the water surface is spaced away from the steam outlet by over 1 cm, even if deaeration occurs in the steam generation chamber, water is not carried to the outlet.

A method for controlling the above-mentioned steam flow will now be described.

If steam is supplied from a closed steam generation chamber to a vacuum chamber via a mass-flow controller, the maximum flow is determined by the capacity of the steam supply system and the water temperature in the steam generation chamber. It is also a consideration that the water temperature must be kept high enough in the pipe system to prevent condensation of the steam.

If the maximum flow is 500 cc/min. at a water temperature of 50° C., and if the mass-flow controller has an allowable flow of more than 500 cc/min., flow control must be conducted in a range of about 0–500 cc/min., and if the mass-flow controller has an allowable flow of less than 500 cc/min., flow control must be conducted in a range of about 0 to the maximum allowable flow of the mass-flow controller.

However, if the flow in the mass-flow controller is reduced, the steam may condense and the mass-flow controller would thus become blocked. The reason for this is that when the steam passes through the orifice of the mass-flow controller, the steam is cooled by adiabatic cooling due to the difference between the pressures on the upstream and the downstream sides of the mass-flow controller. Therefore, the actual controllable flow range depends on the pressure of the steam in the supply system.

As described hereinbelow, if the steam flow rate range controlled by the mass-flow controller is 50–100% of the maximum steam flow determined by the steam pressure in the steam supply system, it has been found that blockage will not occur.

In order to attain the second object of the present invention, there is provided:

1) a steam supplying method for introducing the steam evaporated in a closed steam supply tank to a vacuum chamber via a pressure reducing mass-flow controller comprising independently controlling the water temperature in the steam supply tank, the temperature in the pipes leading from the supply tank to the mass-flow controller and from the mass-flow controller to the vacuum chamber, and the temperature in the mass-flow controller, such that the water temperature Tt in the water tank, the temperature Tp in the pipes from the water tank to the mass-flow controller and from the mass-flow controller to the vacuum chamber, and the temperature Tm in the mass-flow controller are controlled so that $Tt \leq Tp \leq Tm$; or 2) a steam supplying apparatus for introducing steam evaporated in a closed steam supply tank to a vacuum chamber via a mass-flow controller, comprising a steam supply tank having a temperature controller, a mass-flow controller having a heater and a temperature controller, a pipe system including heaters and temperature controllers for transporting steam from the steam supply tank to the mass-flow controller and from the mass-flow controller to the vacuum chamber, wherein the temperature in said supply tank, said mass-low controller and said pipe system are controlled independently from each other.

The above-mentioned vacuum chamber may be a chamber for a pressure reduction CVA, a pressure reduction oxidization, or a plasma generation (CVD or etching) or the like.

In the steam supplying apparatus of the invention, the mass-flow controller has a large thermal capacity and the steam passes through a small orifice in the mass-flow controller. Therefore, steam flow may easily be blocked in the mass-flow controller. The reason for this is that when the steam passes through the orifice of the mass-flow controller, the steam may be cooled adiabatically due to the pressure difference on the upstream and downstream sides of the orifice. Therefore, to prevent the blockage of steam flow, the place where the temperature must be increased the most is only at the orifice of the mass-flow controller. Therefore, according to the present invention, the water temperature Tt in the water tank, the temperature Tp in the pipe system from the water tank to the mass-flow controller and from the mass-flow controller to the vacuum chamber, and the temperature Tm in the mass-flow controller are controlled so that $Tt \leq Tp \leq Tm$, under the order from smaller conductance.

Thus, temperature reduction due to adiabatic cooling at the orifice in the mass-flow controller and the resultant condensation of steam passing through the orifice will be prevented.

DETAILED DESCRIPTION OF THE INVENTION

Figure 1:
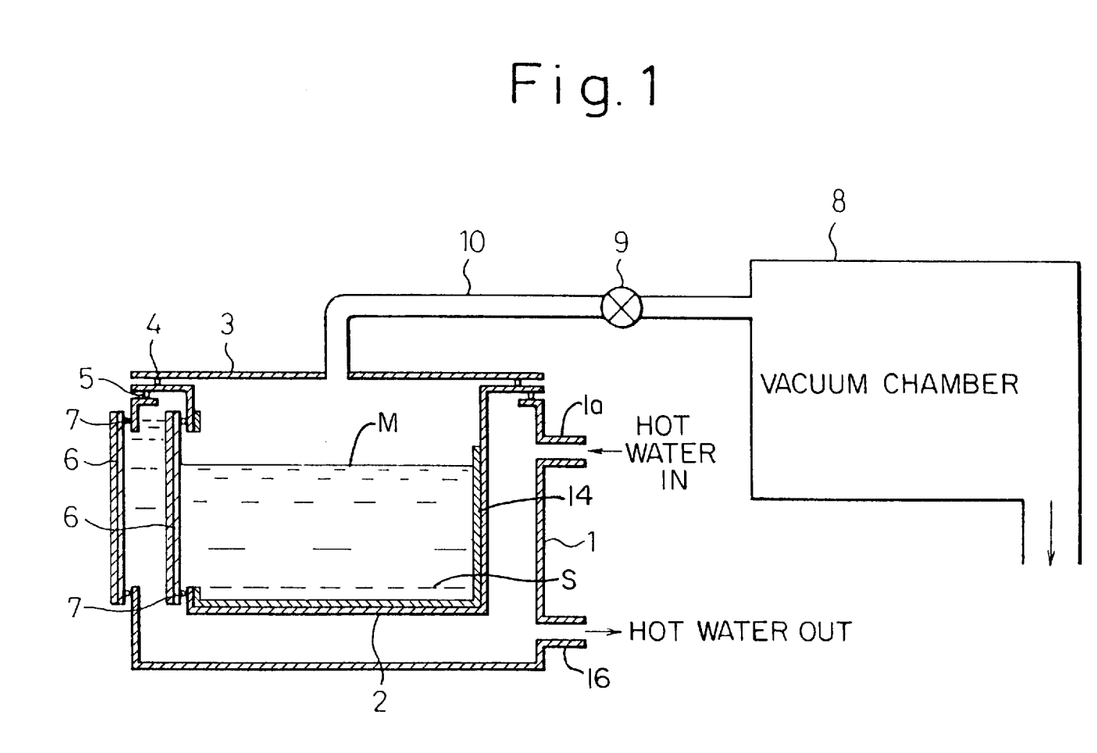
FIG. 1 is a schematic diagram of the apparatus of an embodiment of this invention.

FIG. 1 is a schematic diagram of the apparatus of an embodiment of this invention. This embodiment is a case where the maximum cross-sectional area of the chamber 2 (M)/the minimum cross-sectional area of the chamber 2 (S) is <8.

In FIG. 1, a steam generation chamber defined by a closed vessel 2 and its upper cover 3 are made of aluminum alloy, and the inside surfaces thereof are coated with a thick layer of tritetrafluoroethylene 14 (Teflon: trademark) to prevent the aluminum alloy from being exposed to avoid the formation of pin holes.

In addition, the steam generation chamber 2 is provided with a liquid level monitoring window 6 made of clear quartz glass. Window 6 is sealed with packing 7 made of rubber containing no foreign matter.

A surrounding jacket in the form of a body 1 provides a space between the body 1 and the steam generation chamber 2 which serves as a hot water tank, where the water temperature is controlled by a liquid circulation device, and the hot water circulates through an inlet 1a and an outlet 1b.

Air is discharged from the steam generation chamber 2, which is filled with steam during use.

The thermal conductivity and the temperature control of the steam generation chamber 2 is high and good, so that a certain temperature is easily maintained.

In a test situation, the steam generation chamber 2 was filled with pure water and maintained at 50° C., and the results of an analysis for foreign matter were as follows at the beginning and after 20 days.

| Kind of Foreign Matter | Na | | Fe | | Ca |
|---|---|---|---|---|---|
| Initial Amount (mg/l) | 0.05 | | 0.01 | | 0.12 |
| Amount After 20 days (mg/l) | 0.16 | ≦ | 0.01 | ≦ | 0.02 |

According to this table, it is found that change of foreign matters is small.

In a first comparison test, the steam generation chamber 2 was made of uncoated aluminum. Under the same conditions, the amount of foreign matter was more than twice as much as shown.

In a second comparison test, the steam generation chamber 2 was made of enameled soda glass. Under the same conditions, the amounts of Fe and Ca contamination increased by several mg/l and the amount of Na contamination increased by several tens of mg/l.

Figure 2:
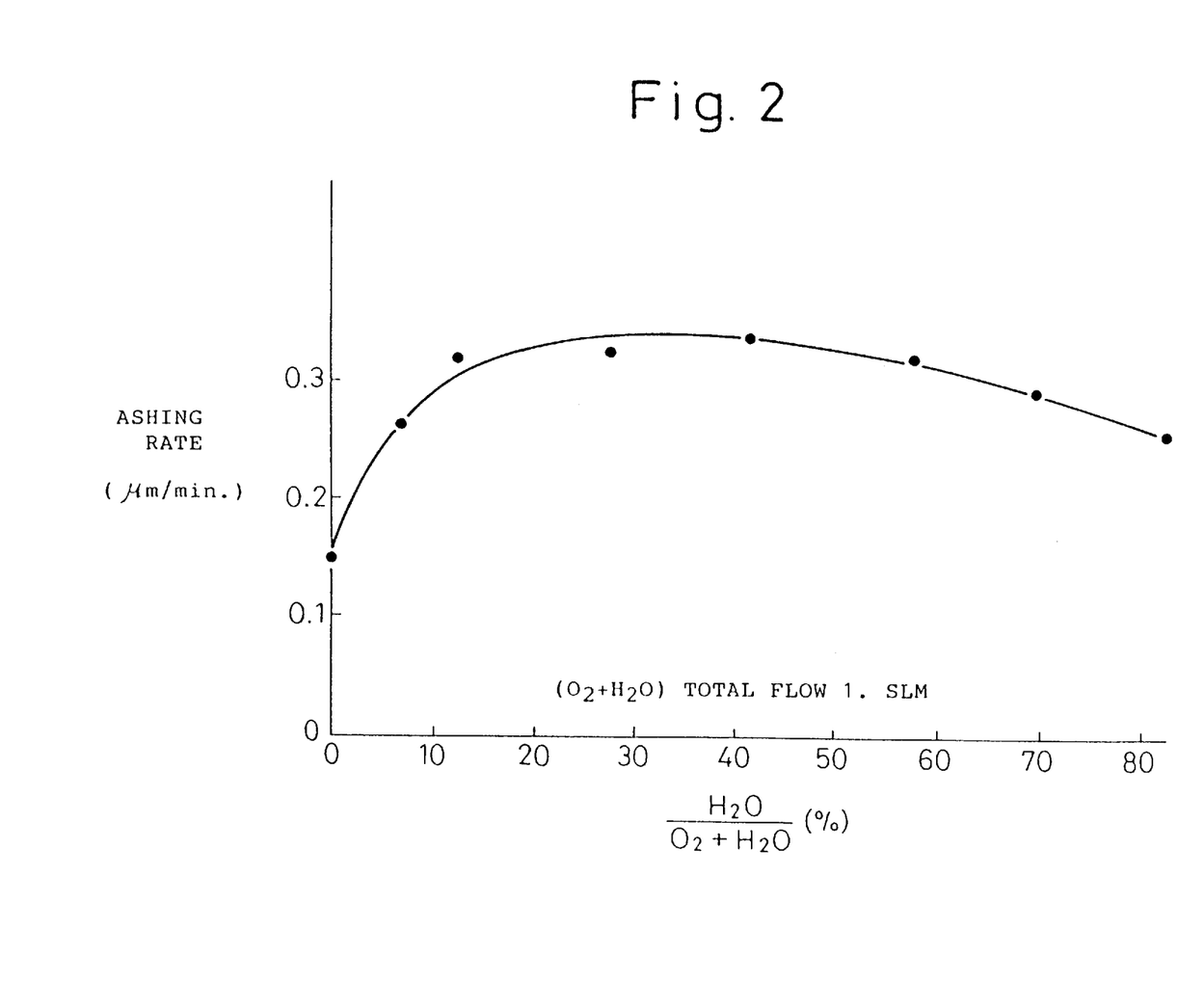
FIG. 2 is a graph showing the characteristics of a downstream ashing process using oxygen and steam.

FIG. 2 is a chart showing the characteristics of downstream ashing using oxygen and steam.

After an ashing process, steam ($H_2O$) and oxygen ($O_2$) are supplied to a vacuum chamber 8 via separate lines. That is, the steam is supplied to the vacuum chamber from the steam generation chamber 2 as shown in FIG. 1, and the oxygen is supplied from an oxygen bomb via valves or the like to the vacuum chamber 8 where the gases are mixed.

It is found that the ashing rate (length of exfoliation in a direction for a certain time) depends on $H_2O/(O_2+H_2O)$ % and it is necessary to supply the steam at a predetermined rate of flow so that $H_2O/(O_2+H_2O)$ is in the range from 10 to 80% to attain a maximum ashing rate.

The flow of steam supplied from steam generation chamber 2 to the vacuum chamber 8 depends on the water surface area, assuming that the capacity of the pipe system connecting both chambers is constant. Therefore, it becomes necessary to determine the parameters within which the water surface area may vary. Thus, assuming that a maximum of the water surface area is M and a minimum thereof is S, if M/S<8, the same ashing rate could be constantly obtained.

Figure 3:
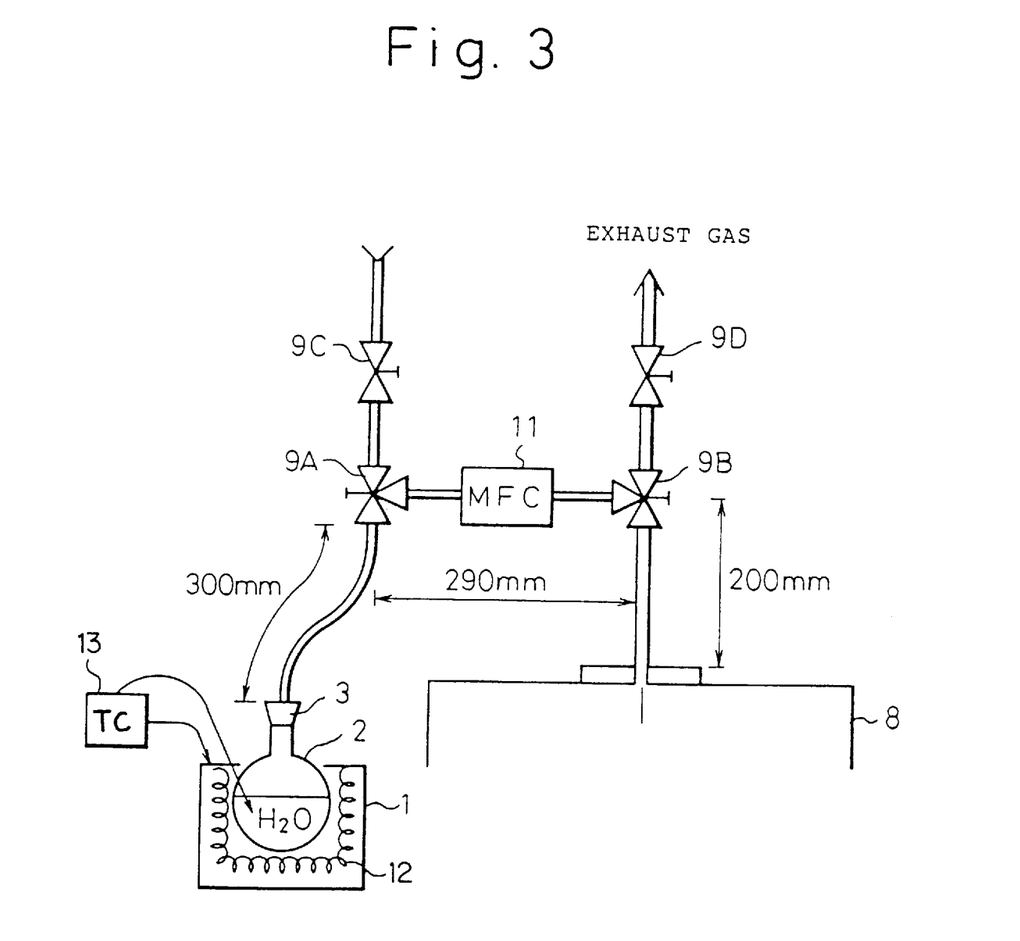
FIG. 3 is a schematic diagram of an apparatus used in an experiment for testing the flow control in a mass-flow controller.
Figure 3A:
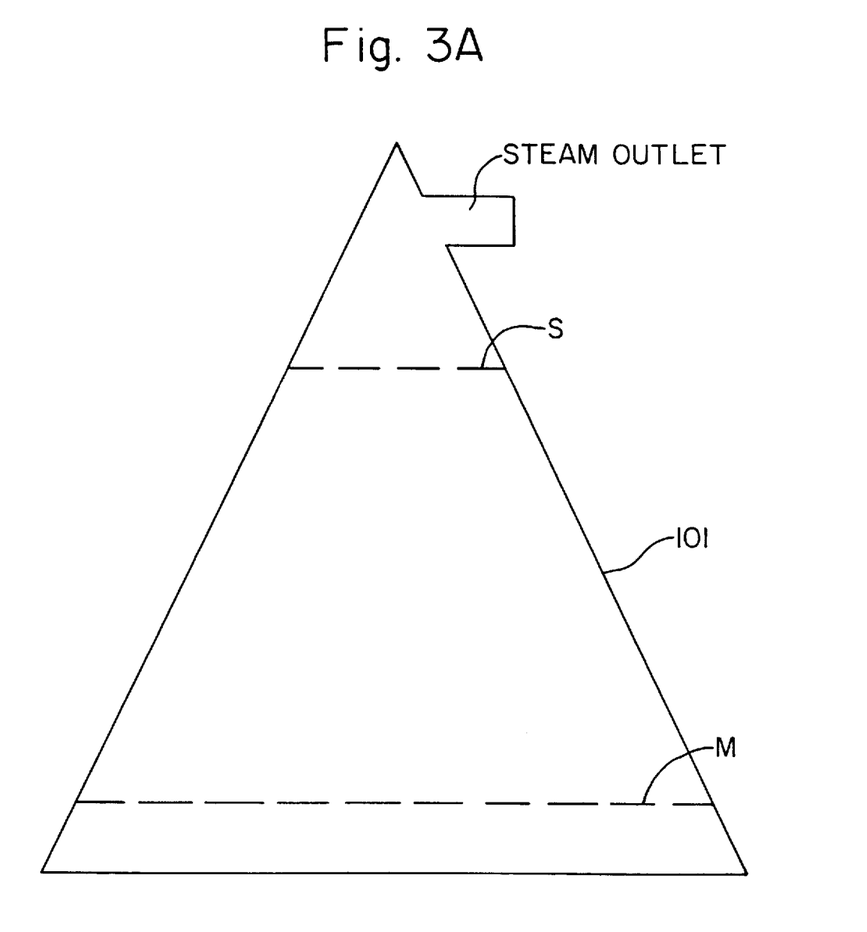
FIG. 3A is a schematic diagram of a conical steam generation chamber.

In an experiment, a conical chamber 101 as shown in FIG. 3A having an upper area S=1 and a lower area M=8 was used. In this case, during a change of water surface from S to M, the ashing rate was substantially constant at 0.28–0.30 μm/min. Contrary to this, using a chamber when M/S was more than 8, the ashing rate was not constant.

FIG. 3 is a schematic diagram of an apparatus used for testing the flow control in a mass-flow controller.

In FIG. 3, the mass-flow controller (MFC) 11 was an Estec SEC-3400S (Trade name). The apparatus includes a heater 12 and a temperature control device 13.

Figure 4:
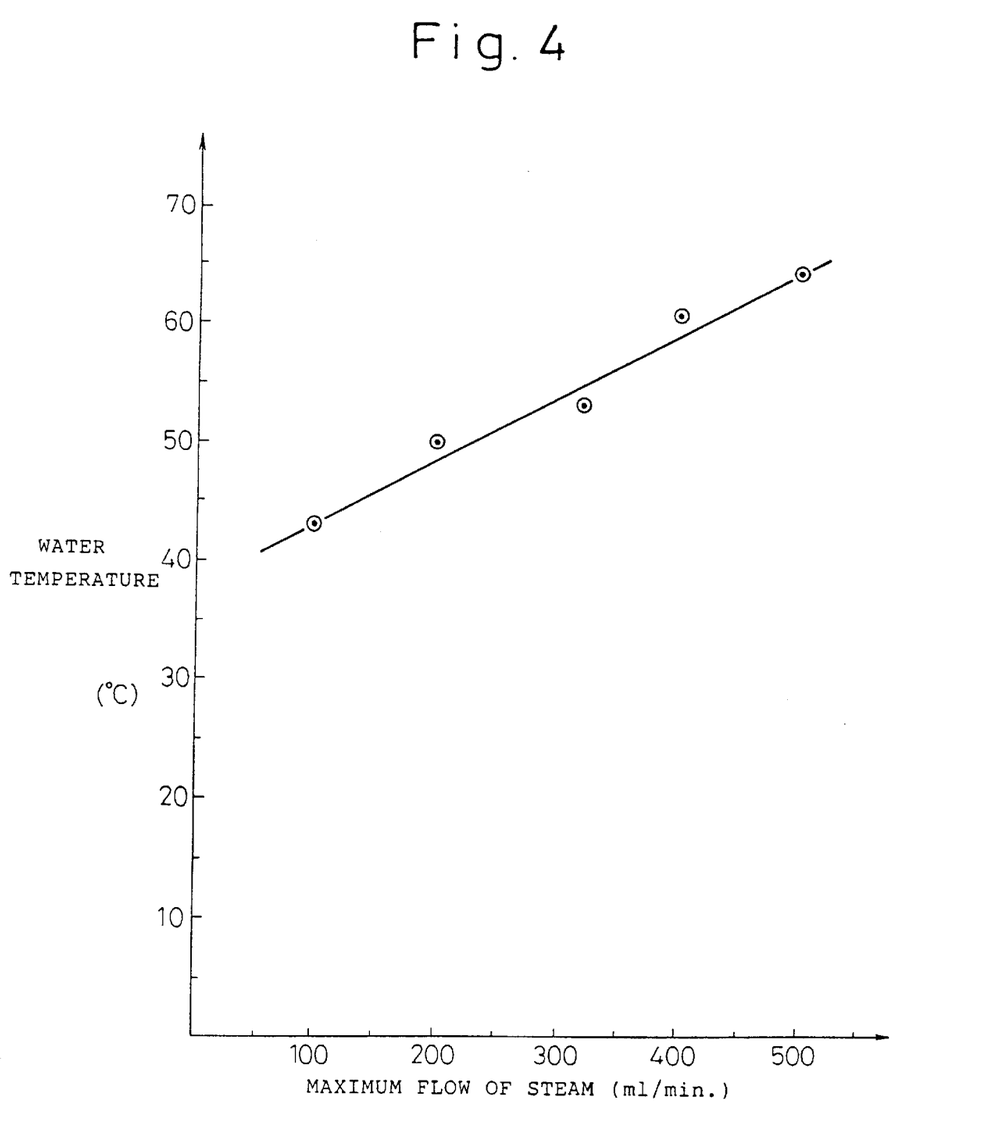
FIG. 4 is a graph showing the relationship between maximum flow and water temperature.

FIG. 4 is a graph showing the relationship between maximum flow and water temperature. In this case, the mass-flow controller was fully opened.

Now, the water temperature was 65° C. and the flow in the mass-flow controller was reduced by 50 ml/min. When the setting value was 300 ml/min., the mass-flow controller was blocked after 5 min. and the flow of steam was stopped.

When the water temperature was 50° C., the mass-flow controller became blocked above 100 ml/min. Even when a different mass-flow controller was used, substantially the same results were obtained.

A case where the steam supply system is applied in connection with an ashing device will now be described.

The steam supply system shown in FIG. 3 was connected to the vacuum chamber of the ashing apparatus. After mixing the steam with the oxygen in the vacuum chamber, a micro wave power of 2.45 GHz was applied to the vacuum chamber to generate a plasma therein.

In this case, the water temperature was 60° C., the flow of steam was 100 ml/min. and the flow of oxygen was 900 ml/min.

The gas flow was continued and after 10 min. the plasma was turned on to start the ashing process. After 1 min., the plasma was turned off and immediately the steam was diverted to a bypass. The steam was introduced to the vacuum chamber after 1 min.

A steam supply test was carried out by repeating such series of operations under the stated conditions in a practical apparatus. It was determined that about 20 sec. after the plasma was turned on for the third time, the plasma color changed from pink to blue and the steam no longer flowed. After foreign matters blocking the mass-flow controller were removed and the water temperature was reduced to 50° C., the plasma processing was started again.

Under these conditions, the mass-flow controller became blocked fifteen times. The water temperature was then reduced to 48° C. and the mass-flow controller no longer became blocked, and the plasma processing could be done for 50 times.

In the same manner, having conducted experiments to determine the water temperatures required for providing a stable flow of steam at 200 ml/min. and 300 ml/min., the results were 58° C. and 60° C., respectively.

That is to say, it was found that if the flow was less than one-half of the maximum flow for a respective water temperature, the mass-flow controller became blocked.

The above-mentioned embodiments involve the following advantages:

1) The inner surfaces of the pipe system for supplying steam to the vacuum chamber are coated with tritetrafluoroethylene to easily prevent contamination and maintain temperature.

2) A bypass is provided to discontinue the supply of steam to the vacuum chamber and instead direct the steam to the vacuum pump when there is no necessity for supplying steam to the vacuum chamber.

Examples of the processing apparatus of this invention are as follows:

1) A plasma processing apparatus in which a gas including at least steam is changed to plasma.

2) A plasma downstream apparatus in which plasma and work pieces are treated separately.

3) A plasma downstream apparatus in which a gas including at least steam is introduced downstream of the plasma.

4) An ashing apparatus in which an ashing process is carried out on an organic substance in the above-mentioned downstream apparatus.

FIG. 5 is a schematic view showing another embodiment of a steam supplying apparatus and a method for controlling the same. The illustrated steam supplying apparatus can be used in connection with a pressure reduction CVD or the like. As seen in FIG. 5, the apparatus includes a closed water tank 21, temperature controllers (TC) 22a, 22b and 22c, pipes 25, heaters 26a, 26b and 26c, and vacuum chamber 27.

As shown in FIG. 5, the steam supplying apparatus is of a type where steam is supplied from the closed water tank 21 via the mass-flow controller 24 to the vacuum chamber 27.

The water tank 21 is provided with temperature controller 22a, and the mass-flow controller 24 is provided with heater 26b, temperature controller 22b, and the pipe system from the water tank 21 to the mass-flow controller 24 and from the mass-flow controller 24 to the vacuum chamber 27, including the pipes 25, the heaters 26a and 26c and the temperature controller 22c. The water tank 21, the mass-flow controller 24 and the pipes 25 are constructed so that their individual temperatures can be independently controlled.

A water supplying method according to the above embodiment will now be described.

First, the flow from water tank 21 is determined by the amount of steam produced, which is maintained by controlling the temperature of water tank 21 using a double-bath system controlled by the temperature controller 22a. The temperature in the portions of the pipe system outside the water tank 21, i.e. in the pipes 25 from the water tank 21 to the mass-flow controller 24 and from the mass-flow controller 24 to the vacuum chamber 27, is controlled by the heaters 26a and 26c enclosing pipes 25 and by the temperature controller 22c. Also, the temperature in the mass-flow controller 24 is controlled by the heater 26b enclosing the mass-flow controller 24 and by the temperature controller 22b.

The water temperature in the water tank 21 necessary to supply a steam flow of 1100 cc/min. to the vacuum chamber 27 was 60° C. The temperature in pipes 25 was 60° C. and that in the mass-flow controller 24 was 80° C. In the prior art the steam was blocked in the mass-flow controller 24 in 5 min. However, in this embodiment, the pipe system was not blocked and the steam could be constantly supplied for over 1 hour at about 1000 cc/min. In addition, since the temperature in pipes 25 was 60° C. and that in the mass-flow controller 24 was 80° C., it was not necessary to raise the temperature (60° C.) in the water tank 21 too much as compared with the prior art. Accordingly, the pipes can be constructed from a flourine resin rather than a metal.

INDUSTRIAL APPLICABILITY

As described above, according to the first embodiment, steam supply with easy control of the water temperature, less foreign substance content and stable flow can be attained. As a result, a stable ashing rate can be obtained, and therefore, accuracy is improved in a wafer process. Particularly, the present invention can thus be effectively used in the manufacture of semiconductor devices or the like According to the second embodiment, it was not necessary to raise the temperature too much in the portions of the pipe system which are not in the water tank, including valves and mass-flow controller, and the flow of system in the mass-flow controller is not blocked, so that it is possible to provide a stable supply of steam. Therefore, in the same manner, the present invention can thus be effectively used in the manufacture of semiconductor devices or the like.

We claim:

1. A method for operating an apparatus for supplying steam to a vacuum chamber, said apparatus comprising a steam generation vessel and a mass-flow controller, said method comprising:

supplying heat to said vessel to evaporate water therein and thereby generate steam for introduction into said chamber;

causing the steam generated in the vessel to pass through said mass-flow controller prior to its introduction into the chamber;

regulating the amount of heat supplied to water in said vessel to thereby maintain a water temperature in said vessel establishing a vapor pressure capable of providing a predetermined maximum steam flow to said chamber; and controlling the operation of the mass-flow controller such that the steam flow into said chamber is maintained at a level which is at least 50% of said predetermined maximum steam flow to thereby minimize condensation of water in said controller and maximize stability of said steam flow.

2. A method for operating a steam supply apparatus as set forth in claim 1, wherein the water temperature in said vessel is maintained at a level such that said predetermined maximum steam flow is less than the maximum flow capacity of said controller.

3. A process for supplying steam to a vacuum chamber, said process comprising:

generating a supply of steam at a first pressure by evaporating water in a closed water tank;

causing said steam supply to flow from said closed water tank to said vacuum chamber through an interconnecting pipe arrangement including (a) a mass-flow controller located between said closed water tank and said vacuum chamber, (b) a first pipe P1 interconnecting said closed water tank and said mass-flow controller, and (c) a second pipe P2 interconnecting said mass-flow controller and said vacuum chamber;

reducing the pressure of said steam supply upstream from said vacuum chamber using said mass-flow controller; and independently controlling the temperature Tt in the water tank, the temperature Tp in said first pipe Tp1 and said second pipe Tp2, and the temperature Tm in the mass-flow controller so that Tm>Tt, Tm>Tp1, and Tm>Tp2.

4. Apparatus for supplying steam to a vacuum chamber, said apparatus comprising:

a closed water tank arrangement including a first heater for evaporating water and thereby generating a supply of steam at a first pressure;

a vacuum chamber;

a first pipe P1 connected to said closed water tank at a point above a water line therein;

a second heater for said first pipe;

a second pipe P2 connected to said vacuum chamber;

a third heater for said second pipe;

a mass-flow controller located between said closed water tank and said vacuum chamber and interconnecting said first and second pipes, said mass-flow controller and said pipes presenting an interconnecting pipe arrangement directing said steam supply so as to flow from said closed water tank to said vacuum chamber, said mass-flow controller being located for reducing the pressure of said steam supply to a second pressure less than said first pressure upstream from said vacuum chamber;

a fourth heater for said mass-flow controller; and a temperature controller system including a first temperature controller controlling said first heater to provide a temperature Tt in said tank, a second temperature controller controlling said second and third heaters to provide a temperature Tp1 in said first pipe and a temperature Tp2 in said second pipe, wherein Tp1=Tp2, and a third temperature controller controlling said fourth heater to provide a temperature Tm in said mass-flow controller, said temperature controller system being operable for independently controlling the temperatures so that Tm>Tt, Tm>Tp1, and Tm>Tp2.

* * * * *